United States Patent
Chang et al.

(10) Patent No.: US 7,030,423 B2
(45) Date of Patent: Apr. 18, 2006

(54) PACKAGE STRUCTURE FOR LIGHT EMITTING DIODE AND METHOD THEREOF

(75) Inventors: Chih-Sung Chang, Hsinchu (TW); Tzer-Perng Chen, Hsinchu (TW); Pai-Hsiang Wang, Taoyuan (TW)

(73) Assignee: Epistar Corporation, Hsinchu (TW)

( * ) Notice: Subject to any disclaimer, the term of this patent is extended or adjusted under 35 U.S.C. 154(b) by 20 days.

(21) Appl. No.: 10/715,863

(22) Filed: Nov. 19, 2003

(65) Prior Publication Data

US 2004/0099874 A1 May 27, 2004

(30) Foreign Application Priority Data

Nov. 21, 2002 (TW) .............................. 91133963 A (51) Int. Cl.
*H01L 33/00* (2006.01)
(52) U.S. Cl. ........................ 257/98; 257/99; 257/100
(58) Field of Classification Search .......... 257/98–100; 362/800, 294, 296, 310, 341
See application file for complete search history.

(56) References Cited

U.S. PATENT DOCUMENTS

| | | | |
|---|---|---|---|
| 6,034,712 A * | 3/2000 | Iwasaki | 347/241 |
| 6,204,523 B1 | 3/2001 | Carey et al. | |
| 6,345,903 B1 | 2/2002 | Koike et al. | |
| 6,428,189 B1 | 8/2002 | Hochstein | |
| 6,809,261 B1 * | 10/2004 | Ng et al. | 174/52.2 |
| 2001/0030866 A1 | 10/2001 | Hochstein | |

* cited by examiner

*Primary Examiner*—Minh-Loan Tran
(74) *Attorney, Agent, or Firm*—Birch, Stewart, Kolasch & Birch, LLP (57) ABSTRACT

A package structure for a light emitting diode (LED) includes a substrate structure and a reflective layer. The substrate structure sequentially includes a conduction board, an insulation layer, and a conductive layer. The substrate structure has an opening to expose the conduction board. The reflective layer configured to support and electrically couple to a first electrode of the LED is disposed in the opening. The reflective layer is electrically coupled to the conduction board and electrically insulated from at least a portion of the conductivity layer, which is coupled to a second electrode of the LED.

24 Claims, 8 Drawing Sheets

PACKAGE STRUCTURE FOR LIGHT EMITTING DIODE AND METHOD THEREOF

This Nonprovisional application claims priority under 35 U.S.C. § 119(a) on Patent Application. 091133963 filed in TAIWAN on Nov. 21, 2002, the entire contents of which are hereby incorporated by reference.

CROSS REFERENCE TO RELATED APPLICATIONS

This application claims priority to Taiwan Patent Application No. 091133963 entitled "Light Emitting diode and Package Scheme and method thereof", filed on Nov. 21, 2002.

FIELD OF INVENTION

The present invention generally relates to a package structure for a light emitting diode, and more particularly, to a light emitting diode with heat dissipation ability.

BACKGROUND OF THE INVENTION

Light emitting diodes (LEDs), because of their unique structure and character of emitting lights, are different from those conventional light sources, and are more applicable to different industrial fields. For example, LEDs are characterized in small size, high reliability, and high output, so they are suitable for many kinds of devices, such as indoor or outdoor large displays. Compared to conventional tungsten lamps, the LEDs work without a filament, consume less power, and respond quicker, so they are widely applied to communication devices or electronic devices. Furthermore, white LEDs have a better illumination effect, a longer lifetime, no harmful material like mercury, a smaller size, and lower power consumption, and therefore the LED devices are advancing in the lamp market.

The operating current of a conventional LED is typically several tens to several hundreds of mAs. Therefore, the brightness of a conventional LED is not suitable for illumination. When lots of LEDs are assembled as an LED lamp to improve the brightness, the volume of the LED lamp is simultaneously multiplied, which results in the loss of its competitiveness. Therefore, to improve the brightness of a single LED is a necessary approach. However, as the LED advances in the market demanding high brightness, the operating current and power of a single LED become several times to several hundred times than those that a conventional LED requires. For example, the operating current of a high brightness LED is about several hundreds of mAs to several amps (A). As a result, the heat generated by the LED becomes an important issue. "Heat" seriously affects the performance of LEDs; for example, the thermal effect will influence the wavelength of lights emitted from the LED, reduce the brightness of lights generated from the semiconductor device, and damage the LED device. Therefore, how to dissipate heat generated by the high power LED determines the development of the LEDs.

When the operating current of LEDs increases, conventional package structures for high power LEDs cannot provide efficient heat dissipation effect. Therefore, there is a need to provide a package structure to dissipate heat generated by LEDs.

SUMMARY OF THE INVENTION

It is one aspect of the present invention to provide a package structure with excellent heat dissipation ability for a light emitting diode having high operating current.

It is another aspect of the present invention to provide a package structure for multiple light emitting diodes to form a light-emitting device with higher brightness or capable of emitting lights in different colors.

In one embodiment, the present invention provides a package structure including a conduction board, an insulation layer disposed on the conduction board, a conductive layer disposed on the insulation layer, and a reflective layer. The conductive layer has an opening, through which the reflective layer is inserted into the insulation layer. The reflective layer configured to support and electrically connect the light emitting diode is electrically coupled to the conduction board and electrically insulated from at least a portion of the conductive layer.

In another embodiment, the package structure further includes a channel for insulating the reflective layer from the portion of the conductive layer. Furthermore, the channel divides the conductive layer into multiple portions so that the reflected layer is electrically insulated from at least two portions of the conductive layer. The package structure further includes an insulation filling layer for filling the channel. Moreover, the package structure includes an adhesive layer for adhering the light emitting diode to the reflective layer. The adhesive layer can have materials such as silver paste, solder, or Indium.

It is a further aspect of the present invention to provide a light-emitting device with excellent heat dissipation ability at low cost. In a further embodiment, the light-emitting device includes the package structure as described above and at least one light emitting diode. The light emitting diode has two electrodes; one is electrically coupled to the reflective layer, and the other is electrically coupled to the portion of the conductive layer which is insulated from the reflective layer.

It is another further aspect of the present invention to provide a method for assembling a light-emitting device. In an exemplary embodiment, the method includes steps of providing a substrate and a light emitting diode having two electrodes. The substrate sequentially includes a conduction board, an insulation layer, and a conductive layer from bottom to top. An opening is formed in the structure to expose the conduction board. A reflective layer is formed in the opening so that the reflective layer is electrically coupled to the conduction board and electrically insulated from at least a portion of the conductive layer. Two electrodes of the light emitting diode are respectively coupled to the reflective layer and the portion of the conductive layer which is insulated from the reflective layer.

The method further includes a step of forming a channel to insulate the reflective layer from the conductive layer. The step of forming the channel includes forming a plurality of channels to divide the conductive layer into multiple portions so that the reflective layer is electrically insulated from at least two portions of the conductive layer. The method further includes a step of forming an insulatoin filling layer in the channel to electrically insulate the reflective layer from the conductive layer. The method further includes forming an adhesive layer on the reflective layer to electrically couple the first electrode of the light emitting diode with the reflective layer. The method further includes forming a metal wire to electrically couple the second electrode of the light emitting diode with the portion of the conductive layer which is electrically insulated from the reflective layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 1:
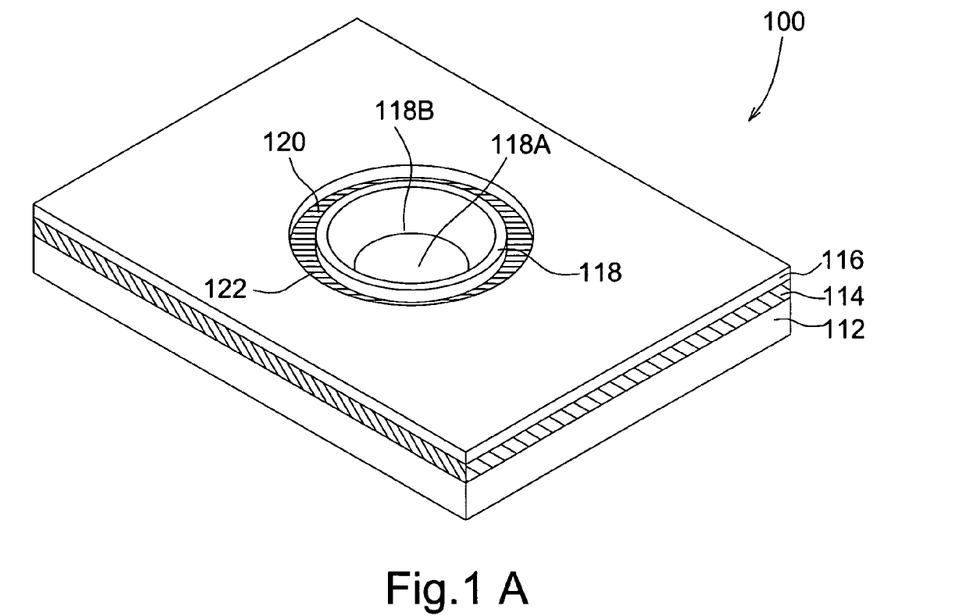
FIG. 1A illustrates a three-dimensional view of a package structure in a first embodiment of the present invention.
FIG. 1B illustrates a cross-sectional view of FIG. 1A.
FIG. 1C illustrates a cross-sectional view of a package structure in a second embodiment of the present invention.
Figure 2:
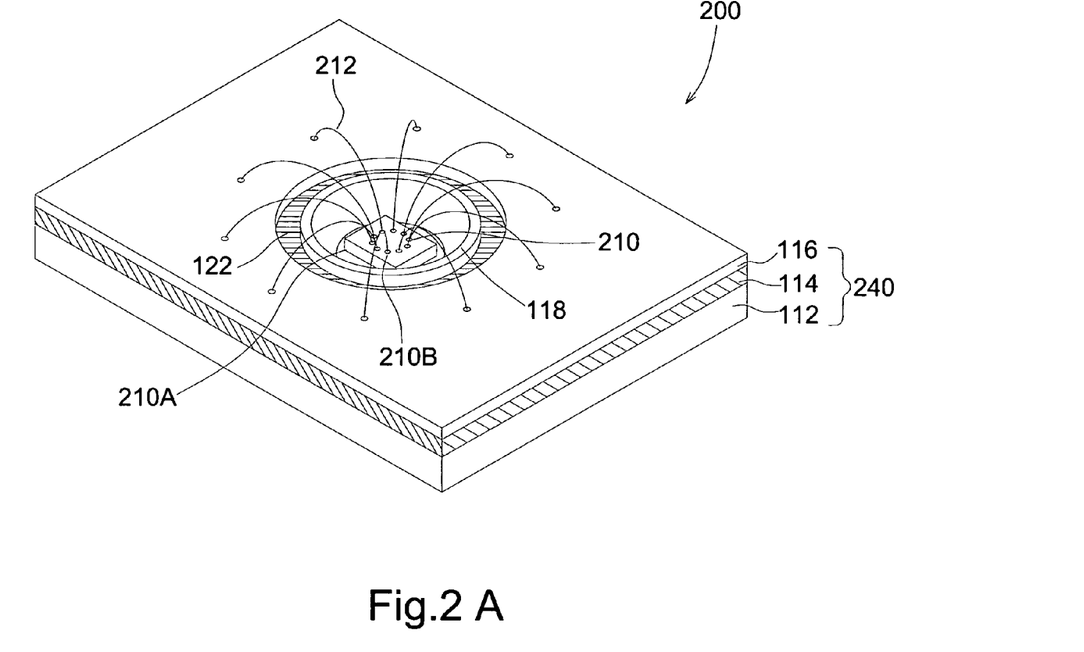
FIG. 2A illustrates a schematic view of an exemplary light-emitting device of the present invention.
FIG. 2B illustrates a cross-sectional view of FIG. 2A.

The present invention provides a light-emitting device with excellent heat dissipation ability, a package structure thereof, and a method of forming the same. FIGS. 1A and 1B respectively illustrate a three dimensional view and a cross-sectional view of a package structure 100 in a first embodiment of the present invention. The package structure 100 includes a conduction board 112, an insulation layer 114 disposed on the conduction board 112, a conductive layer 116 disposed on the insulation layer 114, and a reflective layer 118. The conductive layer 116 has an opening 120, and the reflective layer 118 is inserted into the insulation layer 114 through the opening 120. The reflective layer 118 is electrically coupled to the conduction board 112 and electrically insulated from at least a portion of the conductive layer 116. The reflective layer 116 has a surface 118A for supporting and electrically connecting a light-emitting device, such as a light emitting diode (shown in FIG. 2).

The conduction board 112 is a metal board for dissipating heat generated by the light emitting diode. The metal board is preferably selected from a group consisting of a copper board, an aluminum board, and a combination thereof or the like. Furthermore, the metal board has a thickness preferably in a range of about several micrometers to several millimeters, more preferably larger than 1 mm, to effectively facilitate the dissipation of heat. The insulation layer 114 configured to electrically insulate the conductive layer 116 from the conduction board 112 can be an insulation adhesive layer, which includes epoxy or Teflon. Therefore, the insulation layer 114 can also serve as an adhesive to combine the conductive layer 116 and the conduction board 112. According to different design needs, the insulation layer 114 has a thickness from about one mil to several tens mils. The conductive layer 116 can be a copper layer having a thickness in a range of about 0.1 to several mils. Moreover, the structure of the conduction board 112, the insulation layer 114, and the conductive layer 116 can be a conventional commercial printed circuit board structure, for example, a metal core printed circuit board (MCPCB), which can be further patterned with electronic circuits for different applications.

The reflective layer 118 has a reflection surface 118B for reflecting lights emitted from the light emitting diode. The surface 118A of the reflective layer 118 can also be a reflection surface so as to enhance the reflectivity of lights. The reflective layer 118 can be made of materials with high reflectivity, such as silver or gold, or made of other materials having surfaces 118A and 118B coated with high reflectivity materials. It is noted that the reflective layer has a slanted cup-like reflection surface, but the shape of the reflective layer 118 varies with the design need and not limited to that in this embodiment.

The package structure further includes a channel 122 for insulating the reflective layer 118 from the conductive layer 116. As shown in FIGS. 1A and 1B, the exemplary channel 122 is in a ring shape so that the reflective layer 118 is electrically insulated from the conductive layer 116. Therefore, though the conduction board 112 is electrically coupled to the reflective layer 118, the conduction board 112 and the conductive layer 116 are not short-circuited because of the insulation layer 114 and the channel 122.

FIG. 1C is a cross-sectional view of a modified package structure 150 in a second embodiment of the present invention. Different from the first embodiment, the package structure 150 further includes an insulation filling layer for filling the channel 122 and preventing the conductive layer 116 to short-circuit the conduction board 112 due to the contaminations fallen in the channel 122. Moreover, the reflective layer 154 of the package structure 150 is further inserted into a portion of the conduction board 112. In other words, the reflective layer 118 of the first embodiment substantially touches against the conduction boards, while the reflective layer 154 of the second embodiment passing through the insulation layer 114 is inserted into the conduction board 112. For structures having similar conduction board 112, insulation layer 114, and conductive layer 116, changing the depth of inserting the reflective layer, such as 118 or 154, the reflection surface area 118B or 154B is different so as to meet requirements of various applications.

Referring to FIGS. 2A and 2B, an exemplary light-emitting device 200 is illustrated. The light-emitting device 200 includes a light emitting diode 210 disposed on the package structure 100 of the first embodiment. The light emitting diode 210 has a first electrode 210A and a second electrode 210B, such as an N electrode and a P electrode (or negative and positive electrodes). The conduction board 112, the insulation layer 114, and the conductive layer 116 together are the substrate 240. The reflective layer 118 is inserted into the insulation layer 114 through the conductive layer 116. The surface 118A of the reflective layer 118 supports and electrically connects the light emitting diode 210 so that the heat generated by the light emitting diode 210 can be dissipated. In such an arrangement, the first electrode 210A of the light emitting diode 210 is electrically coupled to the reflective layer 118. The light-emitting device 200 further includes a metal wire 212, such as a gold wire, for coupling the second electrode 210B of the light emitting diode 210 to the conductive layer 116, which is insulated from the reflective layer 118. It is noted that the number of the metal wire 212 varies with the thickness of the metal wire and the magnitude of designed operating current.

As shown in FIG. 2B, the light-emitting device 200 further includes an adhesive layer 214 for adhering the light emitting diode 210 to the reflective layer 118. It is noted that the light emitting diode 210 can be assembled in the package structure 150 or other package structures shown in FIGS. 3 to 6 in a similar manner.

Figure 3:
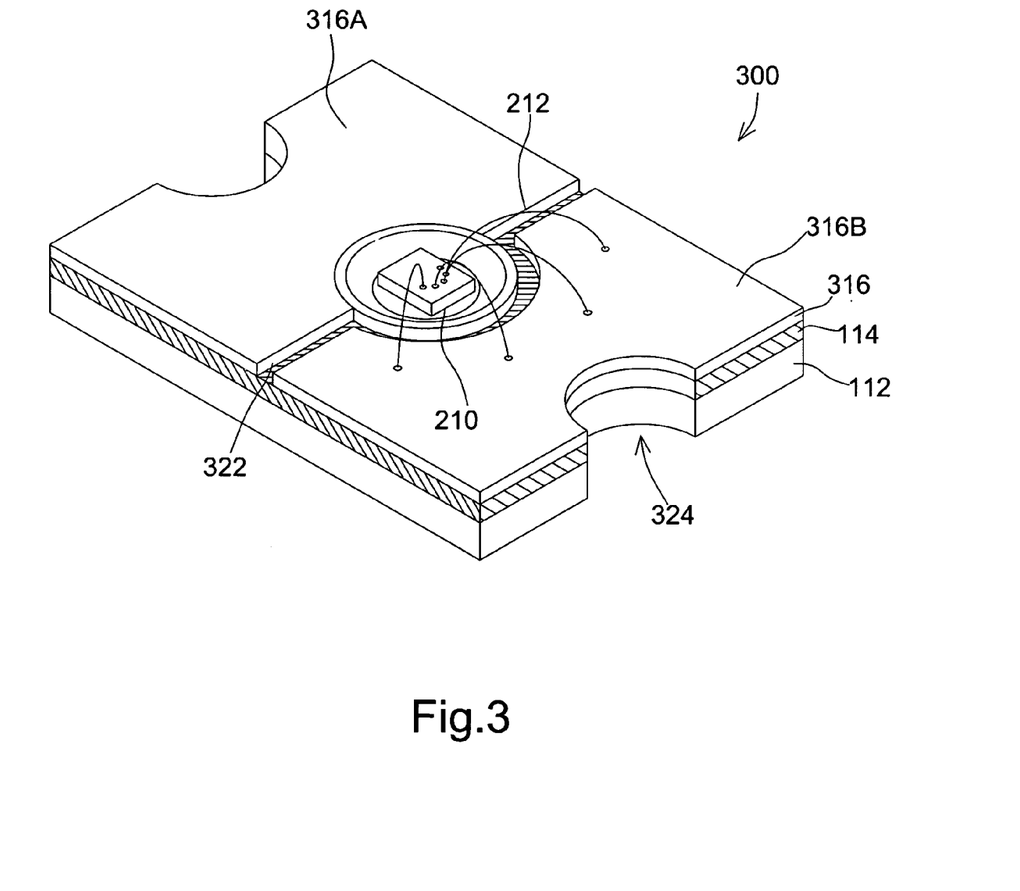
FIG. 3 illustrates a schematic view of a package structure in a third embodiment of the present invention.

Referring to FIG. 3, in a third embodiment, different from the above embodiments, a package structure 300 has a channel 322 not only for insulating the reflective layer 118 from a conductive layer 316, but also dividing the conductive layer 316 into two portions, 316A and 316B. In other words, the portion 316A of the conductive layer 316 is electrically coupled to the reflective layer 118, while the portion 316B is electrically insulted from the reflective layer 118. In this case, the first electrode 210A of the light emitting diode 210 is not only electrically coupled to the conduction board 112 but also to the portion 316A of the conductive layer 316, that increases the feasibility for various circuit designs. Similarly, subsequent electrical connections can be implemented through the portion 316B of the conductive layer 316 to the second electrode 210B of the light emitting diode 210. Furthermore, the periphery of the package structure 300 can have different design, such as recessed surfaces 324 for engaging with screws or rivets to further position the entire light-emitting device on other substrates.

Figure 4A:
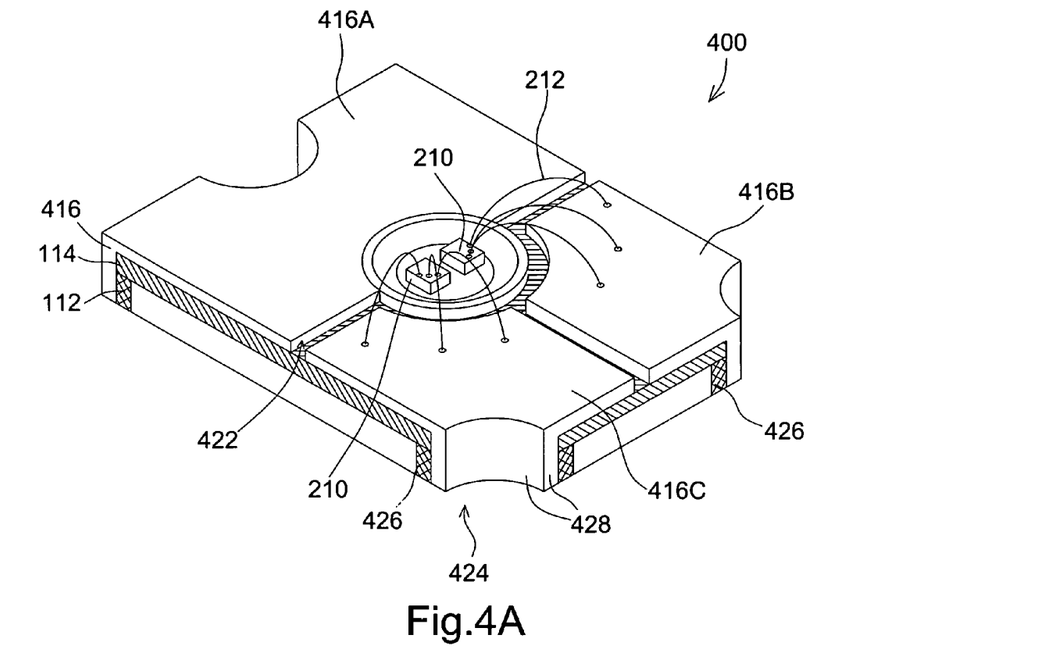
FIG. 4A illustrates a schematic view of a package structure in a fourth embodiment of the present invention.

As shown in FIG. 4, the difference of a package structure 400 of a fourth embodiment is a channel 422 not only for insulating the reflective layer 118 from a conductive layer 416, but also dividing the conductive layer 316 into three portions, 416A, 416B, and 416C, so as to insulate the reflective layer 118 from two portions of the conductive layer 416. In other words, the portion 416A of the conductive layer 416 is electrically coupled to the reflective layer 118, while the portions 416B and 416C are electrically insulted from the reflective layer 118. In this case, two light emitting diodes 210 emitting lights in the same color or in different colors can be disposed together on the reflective layer 118. Electrodes of each of the light emitting diodes 210 can be coupled in a way similar to that described in the third embodiment. For example, each first electrode 210A of the light emitting diode 210 is not only electrically coupled to the conduction board 112 but also to the portion 416A of the conductive layer 416, while each second electrode 210B of the light emitting diode 210 is coupled to a corresponding portion of the conductive layer 416 which is insulated from the reflective layer 118, for example, 416B or 416C. Therefore, by controlling the operating current flowing to the portions 416B and 416C of the conductive layer 416, the brightness or color of lights of the light-emitting device 400 can be adjusted.

Figure 4B:
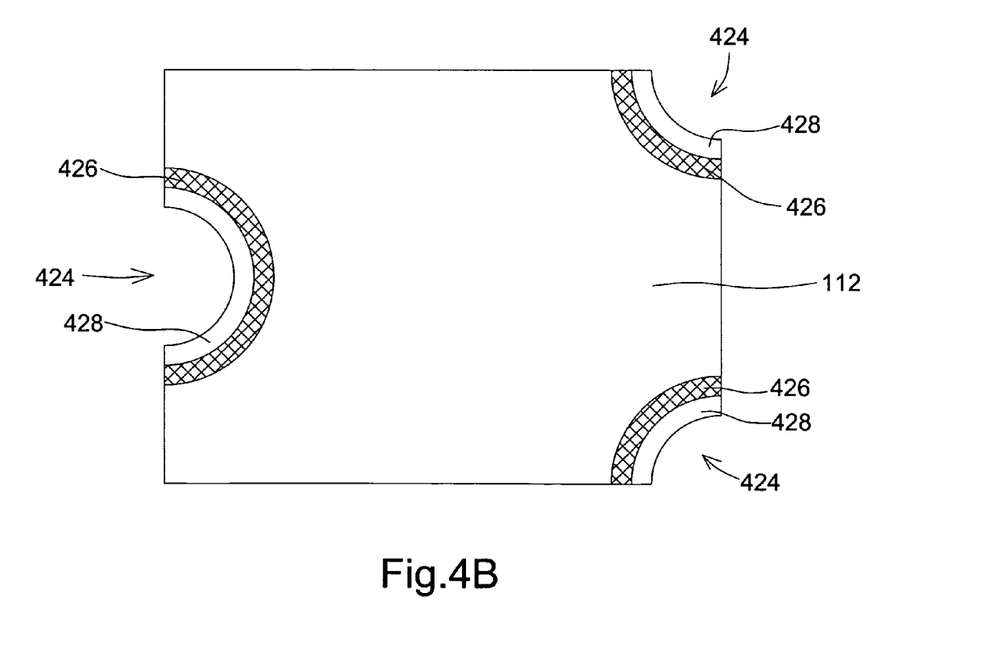
FIG. 4B illustrates a bottom view of FIG. 4A.

Referring to FIGS. 4A and 4B, the package structure 400 has a design (modified recess 424) similar to that of recessed surfaces 324 shown in FIG. 3. It is noted that an isolation layer 426 is coated on the surface of the modified recess 424, and a portion of the conduction board 112 electrically insulates the conduction board 112 from an extension region 428 of the conductive layer 416. In such a configuration, subsequent electrical connections can be made in the same direction of the conduction board 112 through the modified recesses 424 to increase application varieties.

Figure 5:
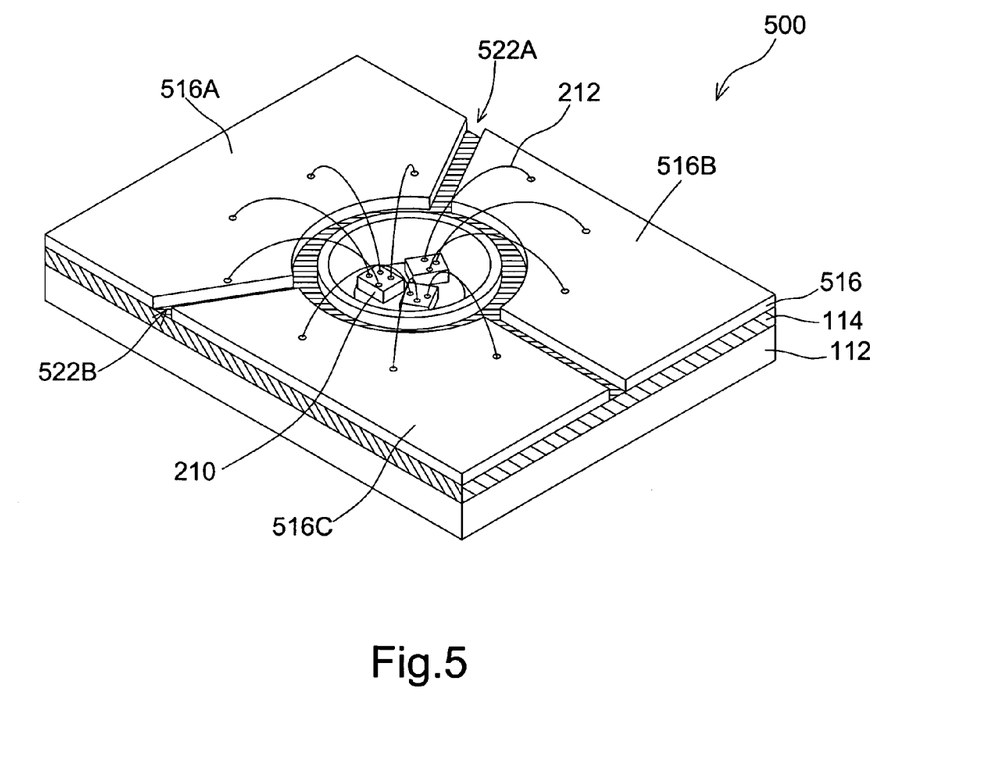
FIG. 5 illustrates a schematic view of a package structure in a fifth embodiment of the present invention.

As shown in FIG. 5, the difference of a package structure 500 of a fifth embodiment is having a plurality of channels 522S and 522B, which absolutely insulate the reflective layer 118 from the conductive layer 516 and divide the conductive layer 516 into three portions 516A, 516B, and 516C. In this embodiment, three light emitting diodes 210 are disposed on the reflective layer 118. Each first electrode 210A of the light emitting diode 210 is connected in a manner similar to the aforesaid connections, coupled to the reflective layer 118. Each second electrode 210B is independently coupled to a corresponding portion of the conductive layer 516, such as portions 516A, 516B, or 516C. Therefore, by controlling the operating current flowing to the portions 516A, 516B, and 516C of the conductive layer 516, the brightness or the color of lights of the light-emitting device 500 can be adjusted.

Figure 6A:
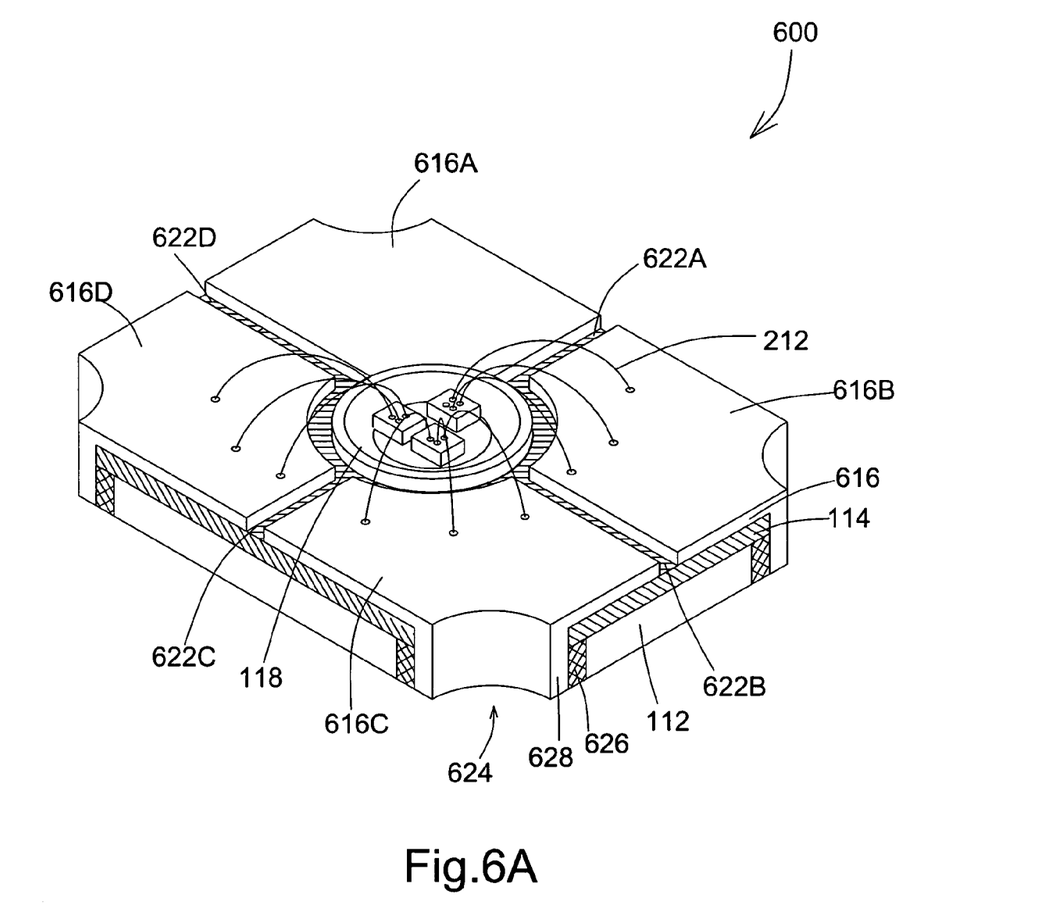
FIG. 6A illustrates a schematic view of a package structure in a sixth embodiment of the present invention.
Figure 6B:
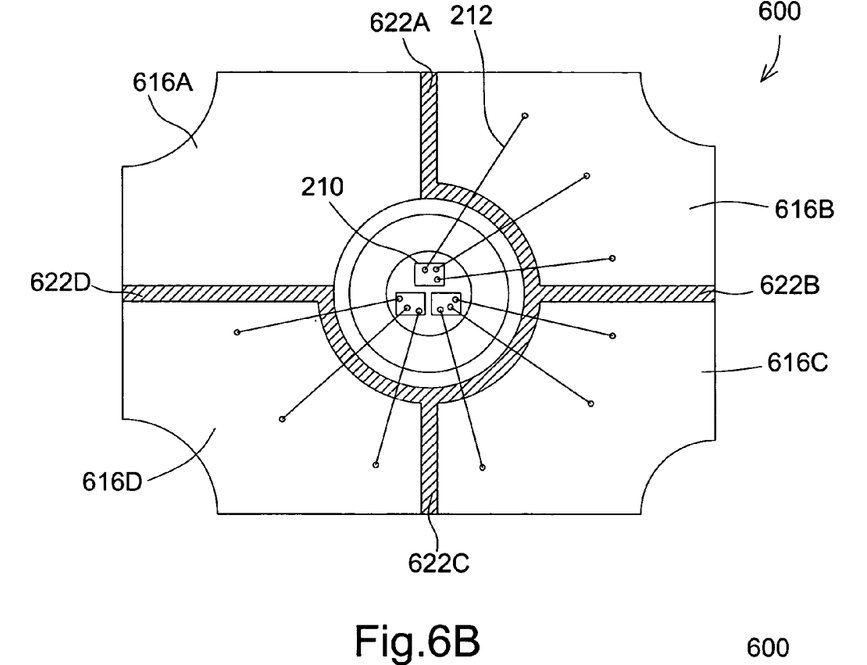
FIG. 6B illustrates a top view of FIG. 6A.
Figure 6C:
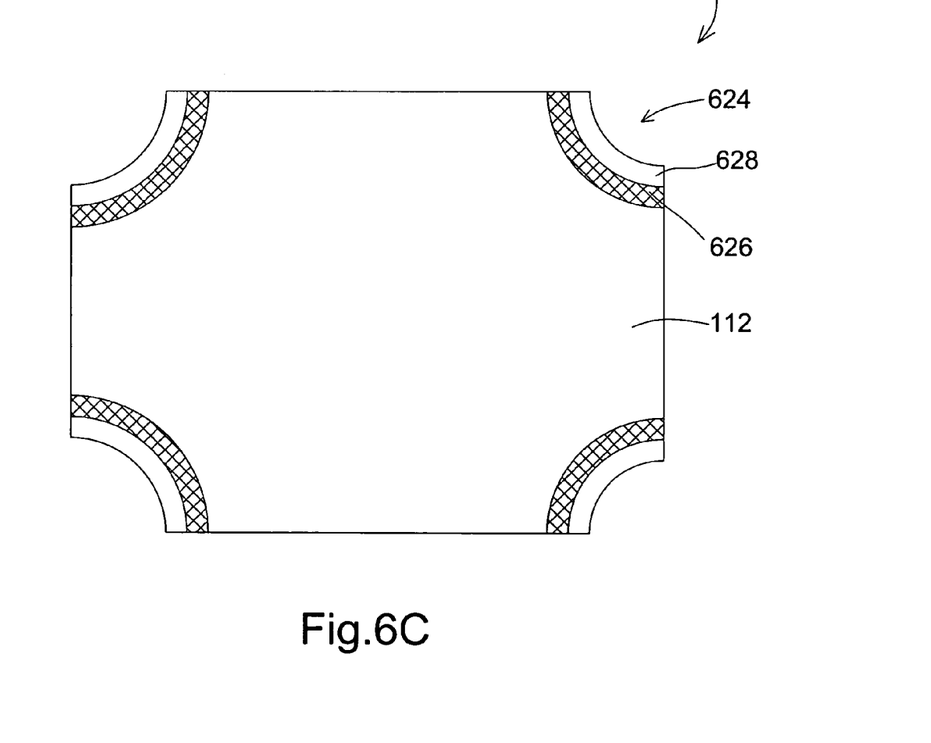
FIG. 6C illustrates a bottom view of FIG. 6A.

Referring to FIGS. 6A, 6B, and 6C, the difference of a package structure 600 of a sixth embodiment is having a plurality of channels 622A, 622B, 622C, and 622D, which divide the conductive layer 616 into 4 portions 616A, 616B, 616C, and 616D and insulate the reflective layer 118 from three portions of the conductive layer 516. In other words, the reflective layer 118 is coupled to the portion 616A of the conductive layer 616 and insulated from the portions 616B, 616C, and 616D of the conductive layer 616. Three light emitting diodes 210 can be disposed on the reflective layer 118. Each first electrode 210A is respectively coupled to the reflective layer 118, while each second electrode 210B is independently coupled to a corresponding portion of the conductive layer 616, such as portions 616B, 616C, or 616D.

Comparing to the package structure 500 shown in FIG. 5, the first electrode 210A of the light emitting diode 210 is coupled to not only the conductive board 112 but also the portion 615A of the conductive layer 616, while the second electrodes 210B of light emitting diodes 210 are respectively coupled to portions 616B, 616C, and 616D of the conductive layer 616 so as to increase applicability to subsequent electrical connections. Similarly, by controlling the operating current flowing to the portions 616B, 616C, and 616D of the conductive layer 616, the brightness or color of lights of the light-emitting device 600 can be adjusted. Furthermore, the periphery of the package structure 600 can have a design of modified recesses 624 similar to those of FIG. 4, which includes an isolation layer 626 for insulating the extension region 628 of the conductive layer 616.

Figure 7:
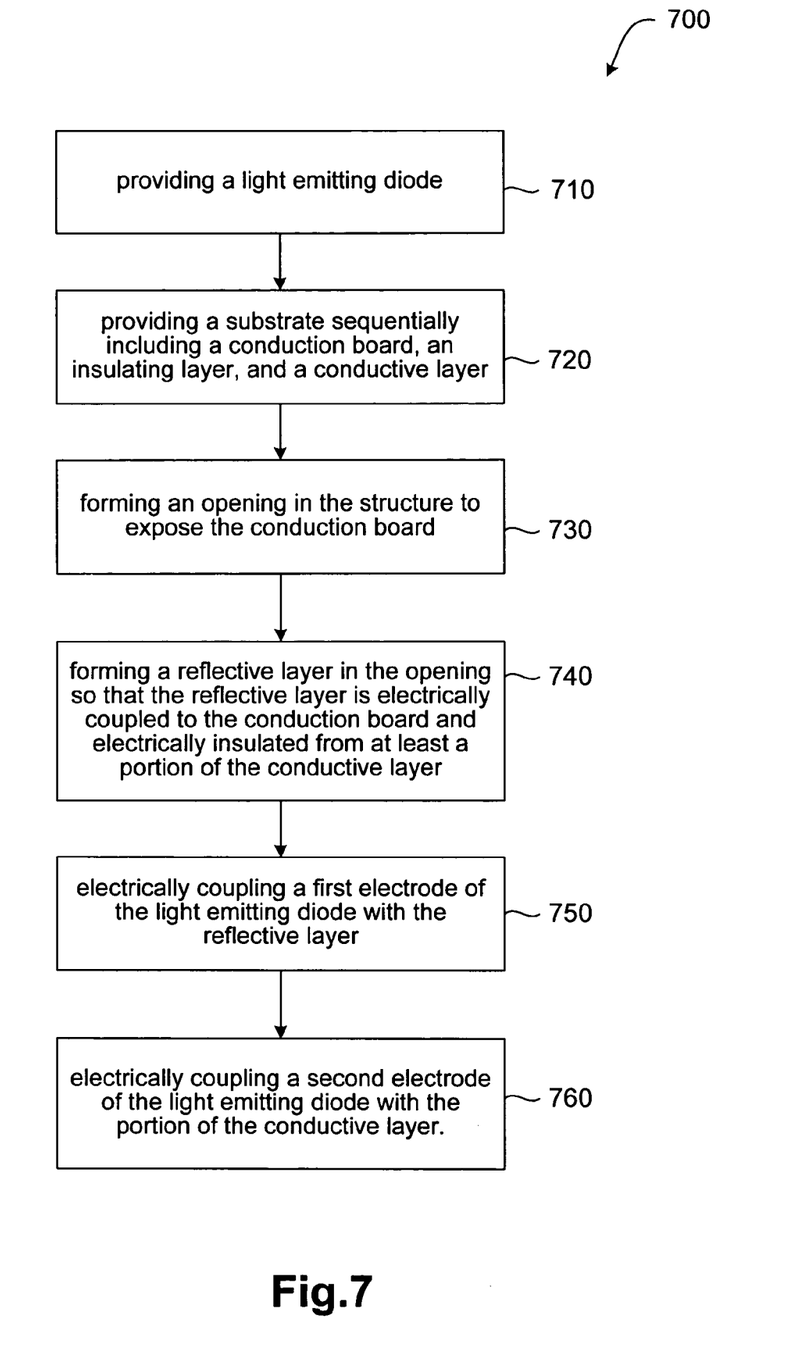
FIG. 7 illustrates a flow diagram of a method for assembling a light-emitting device of the present invention.

Referring to both FIGS. 2 and 7, a method for assembling a light-emitting device is provided. In this embodiment, FIG. 7 represents a flow diagram of forming the light-emitting device shown in FIG. 2. The method includes step 710 of providing a light emitting diode 210 having a first electrode 210A and a second electrode 210B. In step 720, a substrate 240 sequentially including a conduction board 112, an insulation layer 114, and a conductive layer 116 is provided. The substrate 240 can be a conventional commercial printed circuit board, or a substrate formed by stacking desired layers according to the design need. In step 730, an opening 120 is formed in the structure 240 to expose the conduction board 112. In step 740, a reflective layer 118 is formed in the opening 120, so that the reflective layer 118 is electrically coupled to the conduction board 112 and electrically insulated from at least a portion of the conductive layer 116. In step 750, the first electrode 210A of the light emitting diode 210 is electrically coupled to the reflective layer 118, while the second electrode 210B of the light emitting diode 210 is electrically coupled to the portion of the conductive layer, which is insulated from the reflective layer 118 in step 760.

The step of forming the reflective layer 118 can be achieved by conventional technologies, such as electroplating, evaporation, and sputtering, to form a slanted cup-like reflective layer 118. For forming package structure 150 of FIG. 1C, the method further includes to form a channel 122 to insulate the reflective layer 118 from the conductive layer 116. The step of forming the channel includes forming a plurality of channels to divide the conductive layer into multiple portions, so that the reflective layer 118 is electrically insulated from at least two portions of the conductive layer. The method further includes a step of forming an insulation filling layer 152 in the channel 122 to electrically insulate the reflective layer 118 from the conductive layer 116. The method further includes forming an adhesive layer 214 on the reflective layer 118 to electrically couple the first electrode 210A of the light emitting diode 210 with the reflective layer 118. The method includes forming a metal wire 212 to electrically couple the second electrode 210B of the light emitting diode 210 with the portion of the conductive layer 116, which is insulated from the reflective layer 118.

Although specific embodiments have been illustrated and described, it will be obvious to those skilled in the art that various modifications may be made without departing from what is intended to be limited solely by the appended claims.

What is claimed is:

1. A package structure for a light emitting diode, comprising:
   a conduction board;
   an insulation layer disposed on said conduction board;
   a conductive layer, having an opening, disposed on said insulation layer; and
   a reflective layer, inserted into said insulation layer through said opening, for supporting and electrically connecting said light emitting diode;
   a channel for insulating said reflective layer from at least a portion of said conductive layer;
   wherein said reflective layer is electrically coupled to said conduction board and electrically insulated from said at least a portion of said conductive layer.

2. The package structure of claim 1, wherein said reflective layer is further inserted into a portion of said conduction board.

3. The package structure of claim 1, wherein said channel insulates said reflective layer from at least two portions of said conductive layer.

4. The package structure of claim 1, further comprising an insulation filling layer for filling said channel.

5. The package structure of claim 1, further comprising an adhesive layer for adhering said light emitting diode to said reflective layer.

6. The package structure of claim 1, wherein said conduction board is a metal board for dissipating heat generated by said light emitting diode, and said metal board has a thickness in a range of about several hundred micrometers to several millimeters.

7. The package structure of claim 6, wherein said metal board is selected from a group consisting of a copper board, an aluminum board, and a combination thereof.

8. The package structure of claim 1, wherein said insulation layer comprises an insulation adhesive layer including epoxy or Teflon.

9. The package structure of claim 1, wherein said conductive layer is a copper layer having a thickness in a range of about 0.1 to several mils.

10. The package structure of claim 1, wherein said reflective layer has a reflection surface for reflecting lights emitted from said light emitting diode.

11. The package structure of claim 10, wherein said reflection surface comprises a silver surface.

12. The package structure of claim 1, wherein said reflective layer has a slanted cup-like reflection surface.

13. A light emitting device, comprising:
    a light emitting diode having a first electrode and a second electrode;
    a substrate sequentially comprising a conduction board, an insulation layer, and a conductive layer; and
    a reflective layer, inserted into said substrate through said conductive layer, for supporting and electrically coupling to said light emitting diode;
    a channel for insulating said reflective layer from at least a portion of said conductive layer;
    wherein said reflective layer is electrically coupled to said conduction board and electrically insulated from said at least a portion of said conductive layer, said first electrode and said second electrode of said light emitting diode are respectively electrically coupled to said reflective layer and said portion of said conductive layer.

14. The light emitting device of claim 13, wherein said channel insulates said reflective layer from at least two portions of said conductive layer.

15. The light emitting device of claim 13, further comprising an insulation filling layer for filling said channel.

16. The light emitting device of claim 13, further comprising an adhesive layer for adhering said light emitting diode to said reflective layer.

17. The light emitting device of claim 13, comprising a metal wire for coupling said second electrode of said light emitting diode with said portion of said conductive layer.

18. The light emitting device of claim 13, wherein said conduction board is a metal board for dissipating heat generated by said light emitting diode, and said metal board has a thickness in a range of about several hundred micrometers to several millimeters.

19. The light emitting device of claim 18, wherein said metal board is selected from a group consisting of a copper board, an aluminum board, and a combination thereof.

20. The light emitting device of claim 13, wherein said insulation layer comprises an insulation adhesive layer including epoxy or Teflon.

21. The light emitting device of claim 13, wherein said conductive layer is a copper layer having a thickness in a range of about 0.1 to several mils.

22. The light emitting device of claim 13, wherein said reflective layer has a reflection surface for reflecting lights emitted from said light emitting diode.

23. The light emitting device of claim 13, wherein said reflection surface comprises a silver surface.

24. The light emitting device of claim 13, wherein said reflective layer has a slanted cup-like reflection surface.

* * * * *